United States Patent
Vilas Boas et al.

(10) Patent No.: US 8,922,287 B2
(45) Date of Patent: Dec. 30, 2014

(54) AMPLITUDE LOOP CONTROL FOR OSCILLATORS

(71) Applicants: Andre Luis Vilas Boas, Campinas (BR); Alfredo Olmos, Austin, TX (US); Eduardo Ribeiro da Silva, Campinas (BR); Ricardo Maltione, Campinas (BR)

(72) Inventors: Andre Luis Vilas Boas, Campinas (BR); Alfredo Olmos, Austin, TX (US); Eduardo Ribeiro da Silva, Campinas (BR); Ricardo Maltione, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 13/754,873

(22) Filed: Jan. 30, 2013

(65) Prior Publication Data

US 2014/0210565 A1    Jul. 31, 2014

(51) Int. Cl.
*H03B 5/36* (2006.01)
*H03L 5/00* (2006.01)
*H03B 28/00* (2006.01)

(52) U.S. Cl.
CPC . *H03L 5/00* (2013.01); *H03B 28/00* (2013.01)
USPC ............. 331/158; 331/109; 331/116 FE; 331/183; 331/186

(58) Field of Classification Search
USPC ............. 331/15, 109, 116 FE, 154, 158, 160, 331/182, 183, 185, 186, 116 M, 116 R
See application file for complete search history.

(56) References Cited

U.S. PATENT DOCUMENTS

| | | | |
|---|---|---|---|
| 3,654,561 A * | 4/1972 | Egawa et al. | 327/61 |
| 3,824,491 A | 7/1974 | Treadway | |
| 4,360,789 A * | 11/1982 | Lewyn et al. | 331/109 |
| 4,492,935 A * | 1/1985 | Fleischer et al. | 331/135 |
| 4,710,730 A | 12/1987 | Doyle, III | |
| 4,926,442 A * | 5/1990 | Bukowski et al. | 375/317 |
| 5,047,734 A | 9/1991 | Newell | |
| 5,185,585 A | 2/1993 | Newell | |
| 5,999,062 A | 12/1999 | Gilbert | |
| 6,052,036 A | 4/2000 | Enstrom | |
| 6,091,307 A | 7/2000 | Nelson | |

(Continued)

OTHER PUBLICATIONS

Eric A. Vittoz, High-Performance Crystal Oscillator Circuits: Theory and Application, IEEE Journal of Solid-State Circuits, vol. 23, No. 3, Jun. 1988, pp. 774-783.

(Continued)

*Primary Examiner* — Levi Gannon
(74) *Attorney, Agent, or Firm* — Luiz von Paumgartten; Fogarty, L.L.C.

(57) ABSTRACT

Systems and methods for amplitude loop control for oscillators. In some embodiments, an electronic circuit may include oscillator circuitry configured to produce a periodic signal, and control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference. In other embodiments, a method may include receiving a clock signal from a clock generator, determining, using a switched capacitor circuit, a first peak voltage value of the clock signal, determining, using the switched capacitor circuit, a second peak voltage value of the clock signal, and controlling a bias current applied to the clock generator based upon a difference between the first and second peak voltage values.

20 Claims, 5 Drawing Sheets

(56) References Cited

U.S. PATENT DOCUMENTS

| | | |
|---|---|---|
| 6,278,338 B1 | 8/2001 | Jansson |
| 6,653,908 B1 * | 11/2003 | Jones .......................... 331/183 |
| 6,741,137 B1 | 5/2004 | Sibrai |
| 6,747,522 B2 | 6/2004 | Pietruszynski |
| 6,762,627 B1 * | 7/2004 | Gater ............................. 327/58 |
| 6,798,301 B1 | 9/2004 | Balan |
| 6,861,917 B2 * | 3/2005 | Stevenson et al. ............ 331/183 |
| 7,123,109 B2 * | 10/2006 | Stevenson et al. ............ 331/109 |
| 7,332,979 B2 | 2/2008 | Connell |
| 7,675,374 B2 * | 3/2010 | Min et al. ..................... 331/109 |
| 7,961,060 B1 * | 6/2011 | McMenamy et al. ......... 331/186 |
| 8,102,217 B2 * | 1/2012 | Aoki .............................. 331/160 |
| 8,228,130 B1 * | 7/2012 | Ivanov et al. ............. 331/116 M |
| 2013/0009473 A1 * | 1/2013 | Ponton et al. ................... 307/43 |

OTHER PUBLICATIONS

John A. T. M. Van Den Homberg, A Universal 0.03-mm2 One-Pin Crystal Oscillator in CMOS, IEEE Journal of Solid-State Circuits, vol. 34, No. 7, Jul. 1999, pp. 956-961.

Vishnu Balan, A Crystal Oscillator with Automatic Amplitude Control and Digitally Controlled Pulling Range of ± 100 ppm, IEEE International Symposium on Circuits and Systems, 2002, pp. 461-464.

\* cited by examiner

AMPLITUDE LOOP CONTROL FOR OSCILLATORS

FIELD

This disclosure relates generally to electronic devices, and more specifically, to systems and methods for amplitude loop control for oscillators.

BACKGROUND

An "electronic oscillator" includes a resonant circuit designed to produce a periodic, time-varying electrical signal of a given frequency—the inverse of the resonant circuit's period determines its frequency. The electrical signal may be used, for instance, to keep track of the passage of time by counting a number of signal oscillations. A common electronic oscillator employs a quartz crystal as its resonating element, although other types of piezoelectric materials (e.g., polycrystalline ceramics) may also be used.

In certain applications, a "clock generator" may use an electronic oscillator to produce a "clock signal." The clock signal may in turn enable one or more Integrated Circuits (ICs) or the like to synchronize or otherwise coordinate their various operations. Generally speaking, a clock generator has a resonant circuit and an amplifier. The resonant circuit acts as a highly selective band-pass filter that allows only a small range of frequencies to pass through it without much attenuation (other frequencies are essentially filtered out). The amplifier then feeds the resulting periodic signal back into the resonant circuit to maintain its oscillation.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for amplitude loop control for oscillators. In many implementations, these systems and methods may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, television sets, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the systems and methods discussed herein may be incorporated into any device or system having one or more electronic parts or components.

Figure 1:
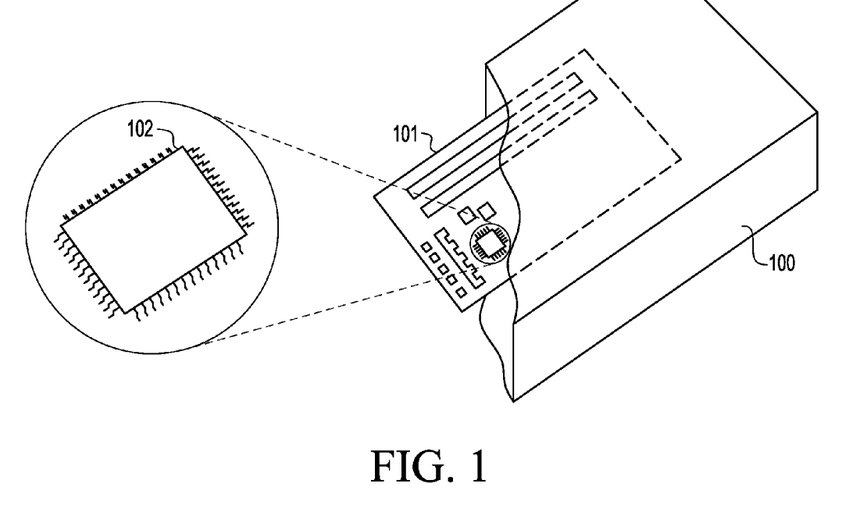
FIG. 1 is a diagram of an example of a Printed Circuit Board (PCB) of an electronic device having one or more Integrated Circuits (ICs) according to some embodiments.

Turning to FIG. 1, a block diagram of electronic device 100 is depicted. In some embodiments, electronic device 100 may be any of the aforementioned electronic devices, or any other electronic device. As illustrated, electronic device 100 includes one or more Printed Circuit Boards (PCBs) 101, and at least one of PCBs 101 includes one or more chips 102. In some implementations, one or more integrated circuits (ICs) within chip 102 may implement one or more of the systems and/or methods described below.

Examples of IC(s) may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-Electro-Mechanical Systems (NEMS), or the like.

As such, an IC within chip 102 may include a number of different portions, areas, or regions. These various portions may include one or more processing cores, cache memories, internal bus(es), timing units, controllers, analog sections, mechanical elements, etc. Thus, in various embodiments, IC(s) may include a circuit configured to receive two or more supply voltages (e.g., two, three, four, etc.). For example, a dual-supply circuit may receive an analog supply voltage configured to power an analog component as well as a digital supply voltage configured to power a logic or digital component. In some implementations, the analog supply voltage may be of the order of 5 V±10%, for example, whereas the digital supply voltage may be of the order of 1.2 V±10%. Other types of circuits may receive any number of supply voltages having any suitable voltage value(s).

Generally speaking, chip 102 may include an electronic component package configured to be mounted onto PCB 101 using a suitable packaging technology such as, for example, Ball Grid Array (BGA) packaging or the like. In some applications, PCB 101 may be mechanically mounted within or fastened onto electronic device 100. It should be noted that, in certain implementations, PCB 101 may take a variety of forms and/or may include a plurality of other elements or components in addition to chip 102. It should also be noted that, in some embodiments, PCB 101 may not be used.

Figure 2:
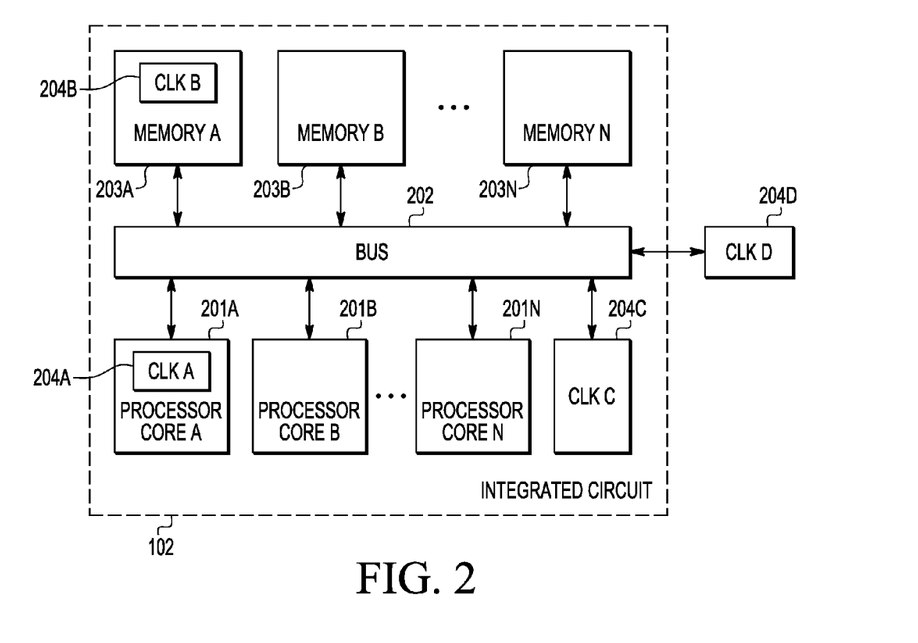
FIG. 2 is a block diagram of an example of an IC according to some embodiments.

FIG. 2 is a block diagram of an example of an IC within chip 102. As illustrated, the IC includes one or more processor(s) or processor core(s) 201A-N operably coupled to bus 202. The IC also includes one or more memory circuit(s) or device(s) 203A-N operably coupled to bus 202. Clock generator or timing (CLK) circuits 204A-D (generically referred to as "CLK circuit 204") are shown in different configurations. Particularly, CLK circuit 204A is integrated or built into processor core 201A and CLK circuit 204B is integrated or built into memory device 203A. CLK circuits 204C and 204D are operably coupled to one or more of processor core(s) 201A-N and/or memory devices 203A-N via bus 202. In this example, CLK circuit 204D is external to the IC—e.g., it may be in another component of PCB 100 of FIG. 1 and operably coupled to the IC via an external bus or line.

It should be noted that the different configurations of CLK circuit 204 and other components of the IC are provided for illustration purposes only. In some implementations, each of memories 203A-N and/or processors 201A-N may have its own internal CLK circuit 204 (i.e., similarly as processor 201A and CLK circuit 204A, or memory 203A and CLK circuit 204B). In other cases, all memory device(s) 203A-N and/or processor(s) 201A-N may share a single CLK circuit 204. It should be understood that, in some embodiments, CLK circuit 204 may be directly coupled to each of memory device(s) 203A-N and/or processor(s) 201A-N without assistance of bus 202. Also, in other embodiments, CLK circuit 204 may be coupled to bus 202 via another bus.

Processor core(s) 201A-N may be any suitable processor core capable of executing program instructions. For example, in various embodiments, processor core(s) 210A-N may be general-purpose or embedded processor(s) implementing any of a variety of Instruction Set Architectures (ISAs), such as the x86, RISC®, PowerPC®, ARM®, etc. In multi-processor systems, each of processor core(s) 210A-N may commonly, but not necessarily, implement the same ISA. In some embodiments, at least one of processor core(s) 210A-N may be an application-specific processing unit such as, for example, a network processor, a Graphics Processing Unit (GPU), or other dedicated device.

As previously noted, each of memory circuit(s) 203A-N may include a suitable memory apparatus such as, for example, RAM, SRAM, MRAM, NVRAM, FLASH, DRAM, SDRAM, DDR SDRAM, EPROM, EEPROM, etc.

Bus 202 may be used to couple master and slave components together, for example, to share data or perform other data processing operations. In various embodiments, bus 202 may implement any suitable bus architecture, including, for instance, Advanced Microcontroller Bus Architecture® (AMBA®), CoreConnect™ Bus Architecture™ (CCBA™), etc. Additionally or alternatively, bus 202 may include, for example, a cross switch, crossbar switch, or the like. In other embodiments, however, bus 202 may be absent and memory 203A, for example, may be integrated into processor core 201A.

CLK circuit 204 may be configured to output a periodic time-varying electrical signal ("clock signal") with a given frequency ("clock rate"). In some implementations, clock rates may range from ~1 MHz to ~10 GHz. For example, a clock signal may be in the form of a square wave with a 50% duty cycle—although other types of waves (e.g., sinusoidal, etc.) with other duty cycles may be used. Such a clock signal may enable various components within the IC and/or different ICs or other electronic devices to synchronize or otherwise coordinate their various operations.

In some embodiments, CLK circuit 204 may include an electronic oscillator having a resonating element such as a quartz crystal, a polycrystalline ceramic, or other piezoelectric material. Generally speaking, the clock signal may be obtained by applying electrical energy to the resonating element.

In various embodiments, the modules or blocks shown in FIG. 2 may represent processing circuitry, logic functions, and/or data structures. Although these modules are shown as distinct blocks, in other embodiments at least some of the operations performed by these modules may be combined in to fewer blocks. Conversely, any given one of the modules of FIG. 2 may be implemented such that its operations are divided among two or more logical blocks. Although shown with a particular configuration, in other embodiments these various modules or blocks may be rearranged in other suitable ways.

In a resonant oscillator without amplitude control, the clock signal can reach the supply rails, thus undesirably increasing Radio Frequency (RF) emissions. Also, other issues can arise from excessive power being applied to the resonating element (e.g., "crystal overdrive"). Such an overdrive condition may act to degrade the resonating element, reducing its performance prematurely. Thus, in an attempt to circumvent these problems, certain oscillators may be designed with built-in amplitude control circuitry. Yet, in a resonant oscillator with amplitude control circuitry, changes in amplitude can lead to small shifts around the comparator thresholds used to generate a square wave from a sinusoidal signal, thus resulting in "jitter."

Accordingly, in many applications (e.g., signal generation for telecommunication systems, etc.), the ability to properly control the amplitude of signals produced by electronic oscillators becomes important. And even when suitable amplitude control circuitry is provided, there are still other factors that can make the clock signal vary undesirably during the electronic oscillator's operation. For example, the internal resistance of a crystal or resonating element may change over time, physical or process variations may affect the amplitude of the clock signal (e.g., crystal-to-crystal variations), changes in ambient temperature may cause additional fluctuations, etc.

To address these, and other issues, systems and methods described herein provide amplitude loop control circuitry suitable to control the amplitude of the sinusoidal waveforms produced by the oscillator provided by CLK circuit 204 of FIG. 2. Examples of such circuitry according to some implementations are described in more detail below with respect to FIG. 3.

Figure 3:
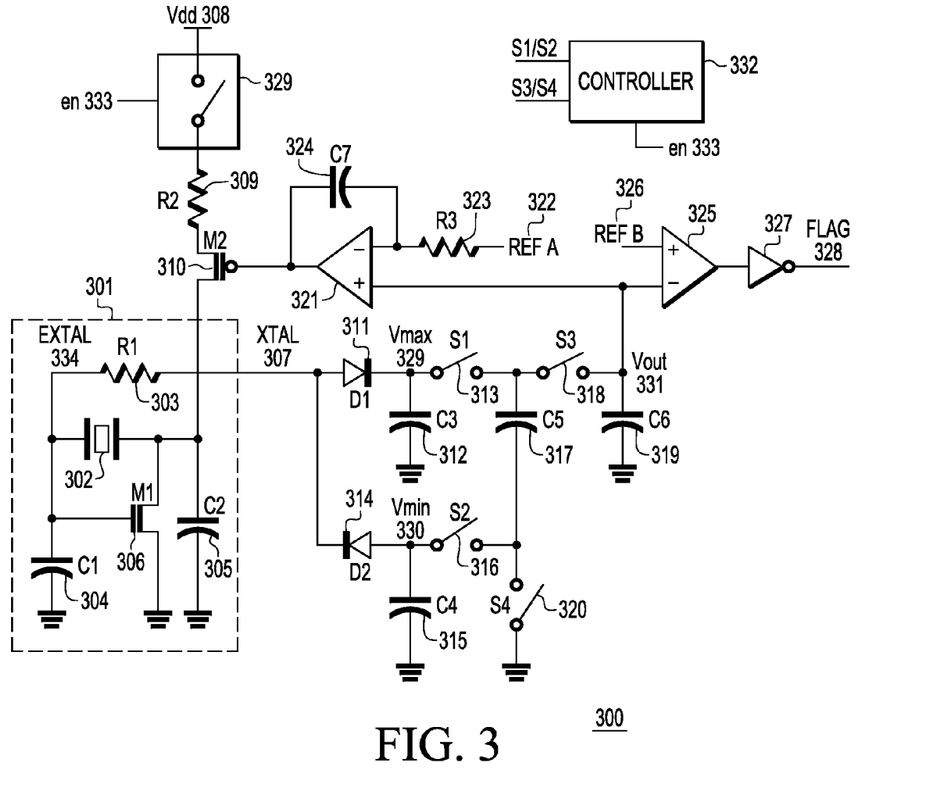
FIG. 3 is a circuit diagram of an example of an amplitude loop control circuitry according to some embodiments.

FIG. 3 is a circuit diagram of an example of amplitude loop control circuitry 300. In some embodiments, amplitude loop control circuitry 300 may be implemented within CLK circuit 204 of FIG. 2. As illustrated, electronic oscillator 301 includes resonating element 302 (e.g., a quartz crystal) operably coupled to first resistor (R1) 303, first capacitor (C1) 304, and second capacitor (C2) 305. Particularly, R1 303, C1 304, and C2 305 are shown coupled in parallel with respect to resonating element 302. Electronic oscillator 301 also includes first transistor (M1) 306 (e.g., an n-type metal-oxide-semiconductor or "NMOS" transistor) with its drain coupled to one terminal of resonating element 302, its gate coupled to the other terminal of resonating element 302, and its source coupled to ground.

During electronic oscillator 301's operation, supply voltage (Vdd) 308 may be applied via switch 329 through second resistor (R2) 309 and second transistor (M2) 310. As such, upon application of enabling signal (en) 333, oscillator 301 outputs periodic signal (XTAL) 307, which may in turn be used as a clock signal, timing signal, or the like. In some cases, XTAL 307 may be further processed by a frequency multiplier or divider circuit (not shown). It should be noted that the particular configuration of electronic oscillator 301 shown in FIG. 3 is known as a "Pierce configuration." In other implementations, however, other oscillator configurations may be used.

Still referring to FIG. 3, circuit elements shown outside of electronic oscillator 301 may be generally referred to as amplitude loop control circuitry 300. As illustrated, amplitude loop control circuitry 300 includes a first peak voltage capturing circuitry, shown as first diode circuitry D1 311 having its anode configured to receive XTAL 307 and its cathode operably coupled to third capacitor (C3) 312, the first peak voltage capturing circuitry also including C3 312 itself. Amplitude loop control circuitry 300 also includes a second peak voltage capturing circuitry, shown as second diode circuitry D2 314 having its cathode configured to receive XTAL 307 and its anode operably coupled to fourth capacitor (C4) 315, the second peak voltage capturing circuitry also including C4 315 itself.

Capacitors C3 312 and C4 315 are each selectably coupled to fifth capacitor (C5) 317 via first and second switches S1 313 and S2 316, respectively. Capacitor C5 317 is selectably coupled to sixth capacitor (C6) 319 via third switch (S3) 318 and to ground via fourth switch (S4) 320. As further explained below, the voltages across capacitors C3 312, C4 315, and C6 319 are referred to as Vmax 329, Vmin 330, and Vout 331, respectively. In some embodiments, the capacitance of each of C3 312, C4 315, and C6 319 may be equal or approximately equal to each other for convenience of design or implementation.

Voltage Vout 331 is provided to the non-inverting input of operational amplifier 321. Operational amplifier 321 is configured as an integrator and receives a first reference voltage value (Ref A) 322 through third resistor (R3) 323. Seventh capacitor (C7) 324 couples the inverting input of operational amplifier 321 to the output of operational amplifier 321. The output of operational amplifier 321 is operably coupled to the gate of M2 310 (e.g., a p-type MOS or PMOS transistor). Additionally or alternatively, Vout 331 may be provided to the inverting input of comparator 325. Comparator 325 is configured to receive a second reference voltage value 326 at its non-inverting input, and its output is coupled to inverter 327. The output of inverter 327 provides flag signal 328.

A shown in FIG. 3, amplitude loop control circuitry 300 may operate in an alternating, switched manner. The analysis can be divided into two phases. During a first phase of operation (e.g., a first time interval or "phase 1"), S1 313 and S2 316 are open while S3 318 and S4 320 are closed. C3 312 stores an electrical charge proportional to the maximum or positive peak voltage of a positive semi-cycle portion of XTAL 307 (Vmax 329), and C4 315 stores an electrical charge proportional to the minimum or negative peak voltage of a negative semi-cycle portion of XTAL 307 (Vmin 330). The voltage stored in C5 317 is transferred in a single-ended fashion to C6 319 via S3 318 and S4 320.

During a second phase of operation (e.g., a second time interval subsequent to the first time interval or "phase 2"), S1 313 and S2 316 are closed while S3 318 and S4 320 are open, and an upper plate of C5 317 stores a charge proportional to Vmax 329 while a lower plate of C5 317 stores a charge proportional to Vmin 330. An electrical charge corresponding to the difference between Vmax 329 and Vmin 330 is stored in C5 in a differential manner. Such a charge is shared, in a single-ended fashion, with C6 319 during a subsequent phase 1, thus producing Vout 331=(Vmax 329−Vmin 330) across C6 319 with reference to ground.

Because capacitors C3 312, C4 315, C5 317, and/or C6 319 share electrical charges among each other under control of switches S1 313, S2 316, S3 318, and S4 320, they are collectively referred to as "switching capacitor circuitry." Although shown in a particular configuration, it should be noted that other switching capacitor circuitries may include more or fewer capacitors, and more or fewer switches, so long as these elements are configured to perform one or more of the operations described herein.

In some embodiments, controller or logic circuitry 332 may receive enabling signal 333 (or another suitable enabling signal), and it may output signals configured to control switches S1 313, S2 316, S3 318, and S4 320. In that regard, Table I below illustrates the status of these various switches when in operation:

TABLE I

| | Switch Status | | | |
|---|---|---|---|---|
| | S1 313 | S2 316 | S3 318 | S4 320 |
| Phase 1 | Open | Open | Closed | Closed |
| Phase 2 | Closed | Closed | Open | Open |
| Phase 3 | Open | Open | Closed | Closed |
| Phase 4 | Closed | Closed | Open | Open |
| Phase n | ... | ... | ... | ... |

In other words, during "phase 1," capacitor C3 312 stores Vmax 329 (i.e., a maximum peak amplitude of XTAL 307), while capacitor C4 315 stores Vmin 330 (i.e., a minimum peak amplitude of XTAL 307), and the charge previously stored in capacitor C5 317 is shared in a single-ended fashion with capacitor C6 319. During "phase 2," C5 317 stores a peak-to-peak amplitude of XTAL 307 across its plates in a differential manner. It should be noted, however, that the status of switches S1 313, S2 316, S3 318, and S4 320 during the "phase 3" are the same as in the "phase 1," such that in effect there are two alternating phases; that is, "phase 3" is a subsequent "phase 1," "phase 4" is a subsequent "phase 2," and so on. These alternating phases of operation are further illustrated in FIG. 5 below.

Once Vout 331 is captured across C6 319, operational amplifier 321 acts as an integrator and the values of C7 324 and R3 323 are chosen in such way to provide proper low pass filtering to avoid high frequency components in Vout 331 coupled onto the output of operational amplifier 321. The output of operational amplifier 321 is used to drive the gate of M2 310 such that more or less electrical current is allowed to flow through M2 310 in a manner proportional to the difference between Vout 331 and reference voltage Ref A 323. Therefore, in steady state conditions, the output of operational amplifier 321 adjusts the current flowing through M2 310 to get a peak-to-peak voltage amplitude of XTAL 307 equal to reference voltage Ref A 323.

Additionally or alternatively, Vout 331 may also be provided to drive comparator 325 along with a second reference voltage (Ref B) 326. When Vout 331 (i.e., the difference between Vmax 329 and Vmin 330) matches reference voltage Ref B 326 (e.g., within a predetermined threshold), flag signal 328 changes its status (e.g., from a logic "0" to a logic "1" or vice-versa), thus indicating that XTAL 307 has reached a steady state condition.

Here it should be noted that circuit 300 also provides a trusted start up. When the oscillation starts to build up, Vout 331 is near 0 V, and the non-inverted input of operational amplifier 321 becomes low when compared to its inverted input. While in this condition, the operational amplifier 321's output tries to go close to ground, and M2 310 acts as a switch, where the maximum current is determined by R2 309. In other words, R2 309 determines the maximum electrical current used during startup.

Figure 4:
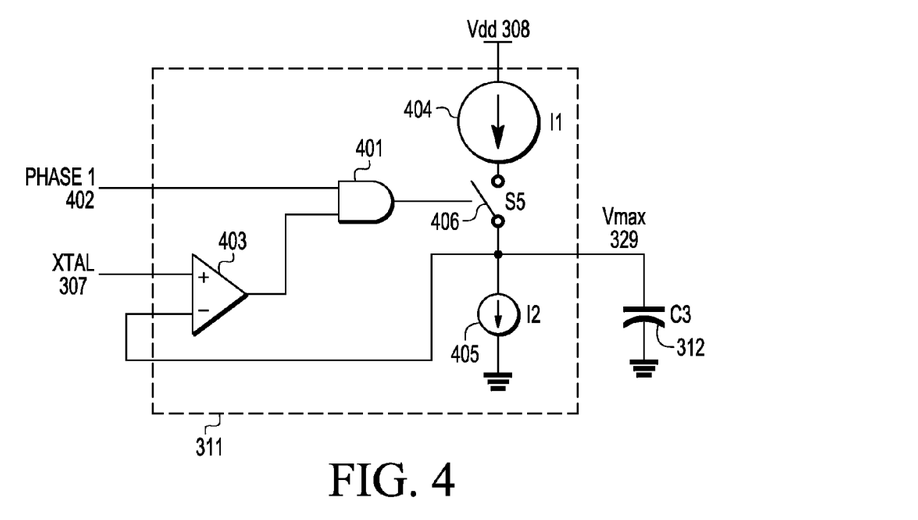
FIGS. 4 and 5 are circuit diagrams of examples of peak voltage capturing circuitry according to some embodiments.

Referring back to the first and second peak capturing circuits described above, in some cases, diode circuitries D1 311 and D2 314 may be implemented as ideal diodes (i.e., such that the voltage drop across circuits 311 or 314 is zero and infinity in forward and reverse bias conditions, respectively) in conjunction with capacitors C3 312 and C4 315. To approximate such a scenario, FIG. 4 shows a circuit diagram of an example of the first peak voltage capturing circuitry according to some embodiments. As illustrated, "phase 1" signal 402 and the output of comparator 403 are coupled to the inputs of AND gate 401. The non-inverting input of comparator 403 is configured to receive XTAL 307, and the inverting input of comparator 403 is operably coupled to capacitor C3 312. The output of AND gate 401 controls the position of fifth switch S5 406, and first current source (I1) is selectably coupled to C3 312 via S5 406.

In some embodiments, the current value of I1 404 may be greater than the current value of I2 405 (e.g., 10 or 100 times greater). When XTAL 307 is higher than Vmax 329 (and during assertion of phase 1 signal 402), the output of AND gate 401 becomes high, thus closing switch S5 406 and charging C3 312 until its voltage is the same as XTAL 307. Second current source I2 405 may be used, for example, to ensure a lock condition (e.g., if Vmax 329 starts with a value above XTAL 307, I2 405 can bring Vmax down to a "comparison region" or range). Thus, during the first phase of operation, the first peak voltage capturing circuitry captures Vmax 329 on the positive semi-cycle portion of XTAL 307, when XTAL 307 is greater than Vmax 329.

Figure 5:
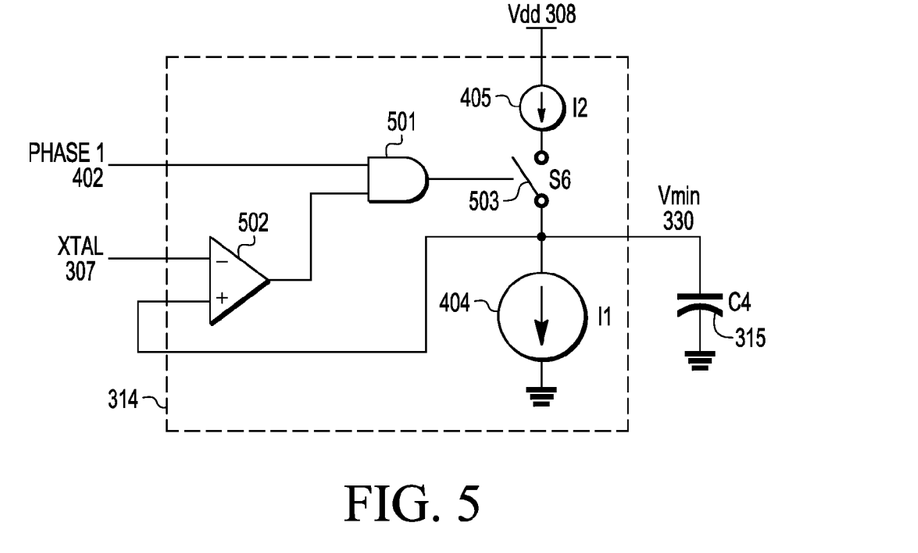

With respect to the second peak voltage capturing circuitry, circuit 314 of FIG. 5 may be implemented. In contrast with circuit 311, however, here XTAL 307 may be coupled to the inverting input of comparator 502, the non-inverting input of comparator 502 may be coupled to Vmin 330 across C4 315. Phase 1 signal 402 may be coupled to an input of AND gate 501, and the output of comparator 502 may be coupled to another input of AND gate 501. Also, I2 405 may be coupled to sixth switch (S6) 503, and it may be smaller than I1 404 (e.g., 10 or 100 times smaller), which is coupled to ground. As such, the second peak voltage capturing circuitry operates during the negative semi-cycle portion of XTAL 307, when XTAL 307 is smaller than Vmin 330.

Figure 6:
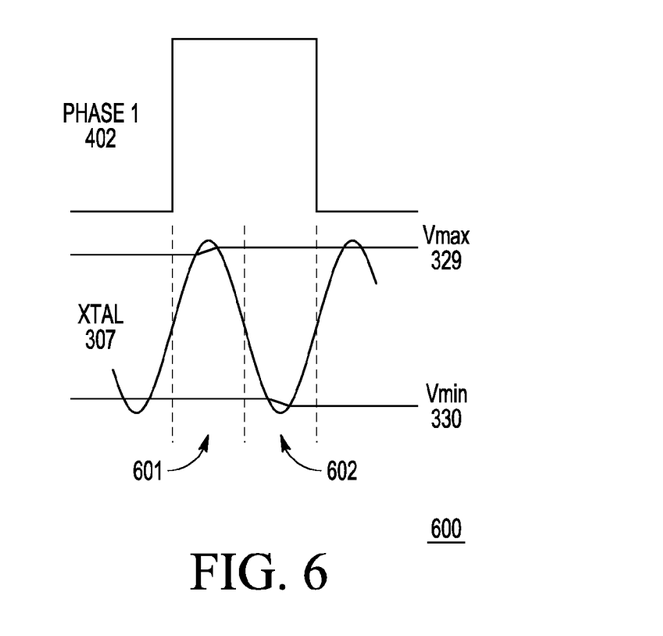
FIG. 6 is a graph illustrating examples of voltage variations in the peak voltage capturing circuitry according to some embodiments.

FIG. 6 is a graph illustrating examples of voltage variations across capacitors C3 312 and C4 315 in amplitude loop control circuit 300 according to some embodiments. As illustrated in graph 600, phase 1 signal 402 is the same as used in FIG. 4. Thus, when phase 1 signal 402 is at a logic high, capacitor C3 312 acquires an updated value for Vmax 329 (during portion 601) and C4 315 acquires an updated value for Vmin 330 (during portion 602) based upon high and low peaks of XTAL 307, respectively. Also, during portion 601, comparator 403 (of FIG. 4) is enabled due to the assertion of phase 1 signal 402, and Vmax 329 is pulled up. Conversely, during portion 602, Vmin 330 is pulled down while its respective comparator (not shown) is turned on.

Figure 7:
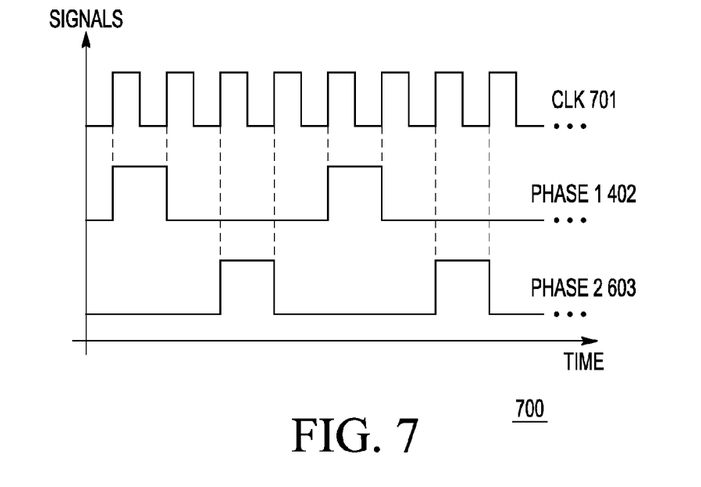
FIG. 7 is a graph illustrating different phases of operation of an amplitude loop control circuitry according to some embodiments.

FIG. 7 is a graph illustrating different phases of operation of amplitude loop control circuit 300 according to some embodiments. As shown, clock signal (CLK) 701 may represent a square wave version of XTAL 307. When phase 1 signal 402 is at a logic high, S1 313 and S2 316 are open, while S3 318 and S4 320 are closed. As such, capacitor C3 312 acquires Vmax 329 and C4 315 acquires Vmin 330. Also, C5 317 is coupled to C6 319, sharing the peak-to-peak amplitude Vout 331 captured in a previous phase 1. When phase 2 signal 603 is at a logic high, S1 313 and S2 316 are closed, while S3 318 and S4 320 are open. Thus, capacitors C3 312 and C4 315 transfer, in a differential fashion, the peak-to-peak amplitude value to C5 317.

Here it may be convenient to note that clock signal 701 may be generated by oscillator circuit 301 itself. The output at EXTAL node 334 has a 180° of phase shift with respect to XTAL node 307, such that a differential comparator may be inserted across resonating element 302 to generate the non-overlapping clocks. In other embodiments, however, a clock buffer circuit or the like may be coupled to XTAL 307 to generate a square wave clock signal.

Phase 1 signal 402 and phase 2 signal 603 may be used to open or close S1 313, S2 316, S3 318, and S4 320 as previously described. In the illustrated embodiment, is noted that phase 1 signal 402 is high for one period of CLK signal 701, phase 2 signal 603 is high for one period of CLK signal 701, and a full period of CLK signal 701 exists between the assertion of phase 1 signal 402 and phase 2 signal 603. In other embodiments, however, phase 1 signal 402 and/or phase 2 signal 603 may have a different shape and/or may use different time intervals (e.g., phase 1 signal 402 and/or phase 2 signal 603 may be asserted for two periods or CLK signal 701, etc.).

Figure 8:
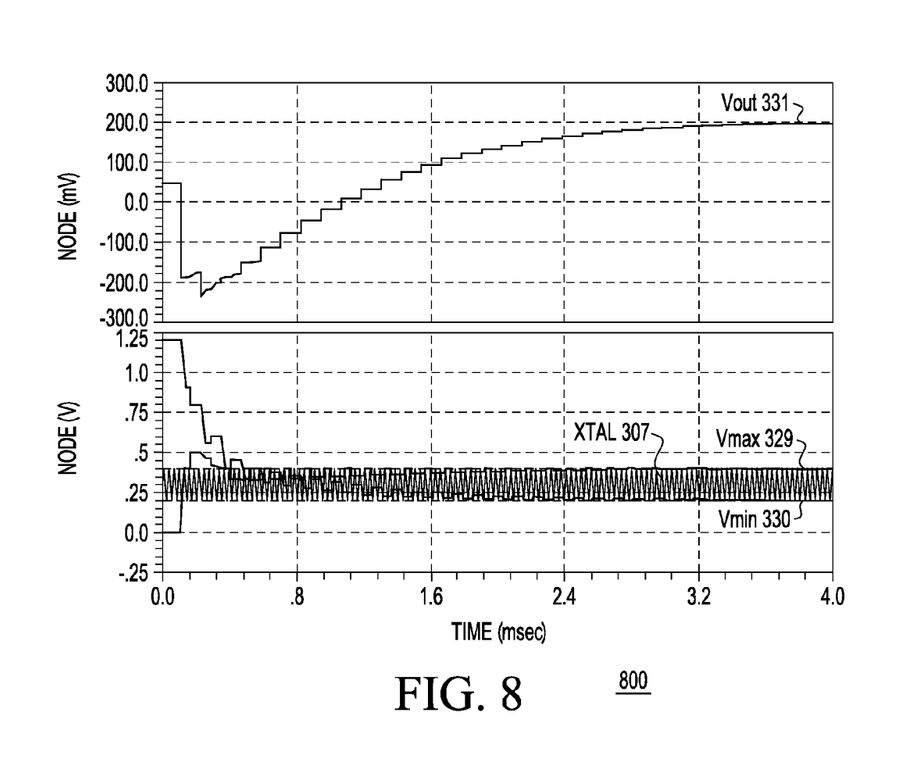
FIG. 8 is a graph illustrating operation(s) of an amplitude loop control circuitry according to some embodiments.

FIG. 8 is a graph 800 illustrating operation(s) of amplitude loop control circuit 300 according to some embodiments. In this example, the peak-to-peak amplitude of XTAL 307 is approximately 200 mV, which is also the difference between Vmax 329 and Vmin 330 stored in C3 312 and C4 315, respectively, after a sufficient amount of time has elapsed (e.g., ~3.2 ms, in this case). Moreover, the amplitude of Vout 331 also assumes the same value of 200 mV at that same time.

Figure 9:
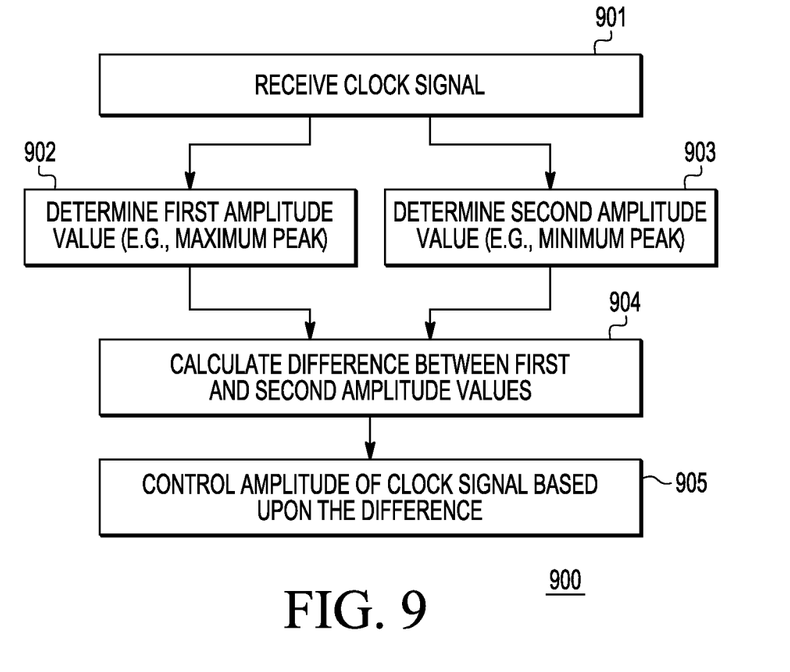
FIG. 9 is a flowchart illustrating operation(s) of an amplitude loop control circuitry according to some embodiments.

FIG. 9 is a flowchart illustrating operation(s) of amplitude loop control circuit 300 according to some embodiments. At block 901, method 900 may include receiving a clock or timing signal (e.g., XTAL 307). At blocks 902 and 903, method 900 may include determining a first amplitude value (e.g., a maximum peak value Vmax 329) with a first switched capacitor (e.g., C3 312) and determining a second amplitude value (e.g., a minimum peak value Vmin 330) with a second switched capacitor (e.g., C4 315), respectively. At block 904, method 900 may include calculating a difference between the first and second amplitude values (e.g., Vout 331) with another one or more switched capacitors (e.g., C5 317 and/or C6 319). Then, at block 905, method 900 may include using a feedback system or the like to control the amplitude of the sinusoidal waveform or timing signal based upon the calculated difference (e.g., using operational amplifier 321 and M2 310). In some cases, method 900 may also include producing a flag signal (e.g., flag 328) indicating that the clock or timing signal has reached a stead state condition (e.g., using comparator 325).

It should be understood that the various operations described herein, particularly in connection with FIG. 9, may be implemented by processing circuitry or other hardware components. The order in which each operation of a given method is performed may be changed, and various elements of the systems illustrated herein may be added, reordered, combined, omitted, modified, etc. It is intended that the invention(s) described herein embrace all such modifications and changes and, accordingly, the above description should be regarded in an illustrative rather than a restrictive sense.

In some embodiments, the systems and methods described herein may provide amplitude control for electronic oscillators with the use of rectifiers implemented by switched capacitor circuitry; thus forming a feedback control system that is highly insensitive to Process, Voltage, and Temperature (PVT) variations. The feedback control system may reduce oscillation distortion and improve accuracy. Also, the circuitry described herein may be implemented with low voltage devices or components, thus reducing their footprint and power consumption and increasing the compatibility with low voltage process generally used in Complementary Metal-Oxide-Semiconductor (CMOS) integrated circuits.

Furthermore, in some implementations, the systems and methods described herein may also enable identification of a clock's steady state condition when its oscillation amplitude is equal or sufficiently equal to (e.g., within a threshold value of) a reference voltage as determined by an analog comparison. This is in contrast with other systems, where a counter may provide a steady state flag based upon an estimated number of pulses (usually considering worst case scenarios that tend to take up more time actually than necessary).

In an illustrative, non-limiting embodiment, an electronic circuit may include oscillator circuitry configured to produce a periodic signal and control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference. For example, the oscillator circuitry may include a crystal oscillator. Also, the crystal oscillator may be in a Pierce configuration.

In some implementations, the switched capacitor circuitry may be configured to determine the maximum peak voltage value and the minimum peak voltage value of the periodic signal during a given time interval when a first set of switches is open and a second set of switches is closed, the switched capacitor circuitry further configured to determine the difference between the maximum and minimum peak voltage values during a subsequent time interval when the first set of switches is closed and the second set of switches is open.

In some embodiments, the switched capacitor circuitry may include first peak voltage capturing circuitry including a first capacitor and configured to receive a positive semi-cycle portion of the periodic signal, the first peak voltage capturing circuitry configured to allow the first capacitor to store a first electrical charge proportional to the maximum peak voltage value during a first time interval, the switched capacitor circuitry further comprising a second peak voltage capturing circuitry including a second capacitor and configured to receive a negative semi-cycle portion of the periodic signal, the second peak voltage capturing circuitry configured to allow the second capacitor to store a second electrical charge proportional to the minimum peak voltage value during the first time interval.

For example, the first peak voltage capturing circuitry may include diode circuitry having its anode configured to receive the periodic signal and its cathode operably coupled to the first capacitor, and wherein the second peak voltage capturing circuitry includes another diode circuitry having its cathode configured to receive the periodic signal and its anode operably coupled to the second capacitor.

Additionally or alternatively, the first peak voltage capturing circuitry may be configured to implement a first AND operator with one of its inputs configured to receive an enabling signal and another of its inputs configured to receive an output of a first comparator, the first comparator configured to receive the periodic signal at its non-inverting input, the first comparator having its inverting input operably coupled to the first capacitor during assertion of the enabling signal, the first peak voltage capturing circuitry further comprising a first current source and a second current source, the first current source selectably coupled to the first capacitor via a switch, the switch controllable by the output of the first AND operator, and the second current source larger than the first current source.

Additionally or alternatively, the second peak voltage capturing circuitry may be configured to implement a second AND operator with one of its inputs configured to receive the enabling signal and another of its inputs configured to receive an output of a second comparator, the second comparator configured to receive the periodic signal at its inverting input, the second comparator having its non-inverting input operably coupled to the second capacitor during assertion of the enabling signal, the second peak voltage capturing circuitry further comprising a third current source and a fourth current source, the third current source selectably coupled to the second capacitor via another switch, the other switch controllable by the output of the second AND operator, and the third current source larger than the fourth current source.

In some embodiments, the switched capacitor circuitry may include a third capacitor operably coupled to the first and second capacitors via a first set of one or more switches, the third capacitor having a first plate and a second plate, the first plate configured to store the first electrical charge and the second plate configured to store the second electrical charge during a second time interval following the first time interval. The switched capacitor circuitry may also include a fourth capacitor operably coupled to the third capacitor via a second set of one or more switches, the fourth capacitor configured to store a difference between the first electrical charge and the second electrical charge relative to a supply voltage while the second plate of the third capacitor is operably coupled to the supply voltage via a third set of one or more switches during a third time interval following the second time interval.

The control circuitry may include integrator circuitry operably coupled to the fourth capacitor and configured to extract a voltage difference between a first reference voltage and a voltage across the fourth capacitor, the control circuitry further configured to alter a bias current provided to the oscillator circuitry through a transistor in a manner proportional to the voltage difference. Additionally or alternatively, the control circuitry may include a comparator operably coupled to the fourth capacitor and to a second reference voltage, the comparator configured to output a flag signal in response to the voltage across the fourth capacitor matching the second reference voltage within a threshold.

In another illustrative, non-limiting embodiment, a method may include receiving a clock signal from a clock generator and determining, using a switched capacitor circuit, a first peak voltage value of the clock signal. The method may also include determining, using the switched capacitor circuit, a second peak voltage value of the clock signal, and controlling a bias current applied to the clock generator based upon a difference between the first and second peak voltage values.

In some cases, determining the first peak voltage value may include determining a maximum peak voltage value, and determining the second peak voltage value may include determining a minimum peak voltage value.

The method may also include determining the first and second peak voltage values during a given operation of the switched capacitor circuit and determining the difference between the first and second peak voltage values during a subsequent operation of the switched capacitor circuit, the switched capacitor circuit having a given switch configuration during the given operation and a different switch configuration during the subsequent operation. The method may further include determining the difference between the first and second peak voltage values comprises storing a first electrical charge proportional to the first peak voltage value in a first capacitor and storing a second electrical charge proportional to the second peak voltage value in a second capacitor as part of a first operation of the switched capacitor circuit.

In some embodiments, determining the difference between the first and second peak voltage values may further include storing the first electrical charge on a first plate of a third capacitor and storing the second electrical charge on a second plate of the third capacitor as part of a second operation of the switched capacitor circuit, the second operation subsequent to the first operation. Determining the difference between the first and second peak voltage values may further include storing a difference between the first and second electrical charges in a fourth capacitor as part of a third operation of the switched capacitor circuit, the third operation subsequent to the second operation.

Controlling the voltage applied upon the clock generator may include comparing a difference between the first and second peak voltage values with a first reference voltage value and varying a bias current of the clock generator based upon a result of the comparison. The method may also include producing a flag signal in response to a difference between the first and second peak voltage values matching a second reference voltage value within a threshold, the flag signal indicating that the clock generator is operating in a steady state condition.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic circuit, comprising:
    oscillator circuitry configured to produce a periodic signal; and
    control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference, the switched capacitor circuitry including a first capacitor configured to store a first electrical charge proportional to a maximum voltage value of the periodic signal during a first time interval, a second capacitor configured to store a second electrical charge proportional to a minimum voltage value of the periodic signal, a third capacitor having a first plate and a second plate, the first plate configured to store the first electrical charge and the second plate configured to store the second electrical charge during a second time interval following the first time interval, and a fourth capacitor configured to store a difference between the first electrical charge and the second electrical charge relative to a supply voltage during a third time interval following the second time interval.

2. The electronic circuit of claim 1, the oscillator circuitry comprising a crystal oscillator in a Pierce configuration.

3. The electronic circuit of claim 1, the switched capacitor circuitry configured to determine the maximum peak voltage value and the minimum peak voltage value of the periodic signal during a given time interval when a first set of switches is open and a second set of switches is closed, the switched capacitor circuitry further configured to determine the difference between the maximum and minimum peak voltage values during a subsequent time interval when the first set of switches is closed and the second set of switches is open.

4. The electronic circuit of claim 1, the switched capacitor circuitry further comprising a first peak voltage capturing circuitry including the first capacitor and a second peak voltage capturing circuitry including the second capacitor.

5. The electronic circuit of claim 4, wherein the first peak voltage capturing circuitry is configured to receive a positive semi-cycle portion of the periodic signal, and wherein the second peak voltage capturing circuitry is configured to receive a negative semi-cycle portion of the periodic signal.

6. The electronic circuit of claim 4, wherein the first peak voltage capturing circuitry includes diode circuitry having its anode configured to receive the periodic signal and its cathode operably coupled to the first capacitor, and wherein the second peak voltage capturing circuitry includes another diode circuitry having its cathode configured to receive the periodic signal and its anode operably coupled to the second capacitor.

7. The electronic circuit of claim 4, the first peak voltage capturing circuitry configured to implement a first AND operator with one of its inputs configured to receive an enabling signal and another of its inputs configured to receive an output of a first comparator, the first comparator configured to receive the periodic signal at its non-inverting input, the first comparator having its inverting input operably coupled to the first capacitor during assertion of the enabling signal, the first peak voltage capturing circuitry further comprising a first current source and a second current source, the first current source selectably coupled to the first capacitor via a switch, the switch controllable by the output of the first AND operator, and the second current source larger than the first current source.

8. The electronic circuit of claim 7, the second peak voltage capturing circuitry configured to implement a second AND operator with one of its inputs configured to receive the enabling signal and another of its inputs configured to receive an output of a second comparator, the second comparator configured to receive the periodic signal at its inverting input, the second comparator having its non-inverting input operably coupled to the second capacitor during assertion of the enabling signal, the second peak voltage capturing circuitry further comprising a third current source and a fourth current source, the third current source selectably coupled to the second capacitor via another switch, the other switch controllable by the output of the second AND operator, and the third current source larger than the fourth current source.

9. The electronic circuit of claim 4, the switched capacitor circuitry further comprising the third capacitor operably coupled to the first and second capacitors via a first set of one of more switches.

10. The electronic circuit of claim 9, the switched capacitor circuitry further comprising a fourth capacitor operably coupled to the third capacitor via a second set of one or more switches, the fourth capacitor configured to store a difference between the first electrical charge and the second electrical charge relative to a supply voltage while the second plate of the third capacitor is operably coupled to the supply voltage via a third set of one or more switches during a third time interval following the second time interval.

11. The electronic circuit of claim 10, the control circuitry further comprising an integrator circuitry operably coupled to the fourth capacitor and configured to extract a voltage difference between a first reference voltage and a voltage across the fourth capacitor, the control circuitry further configured to alter a bias current provided to the oscillator circuitry through a transistor in a manner proportional to the voltage difference.

12. The electronic circuit of claim 10, the control circuitry further comprising a comparator operably coupled to the fourth capacitor and to a second reference voltage, the comparator configured to output a flag signal in response to the voltage across the fourth capacitor matching the second reference voltage within a threshold.

13. A method, comprising:
receiving a clock signal from a clock generator;
determining, using a switched capacitor circuit, a first peak voltage value of the clock signal;
determining, using the switched capacitor circuit, a second peak voltage value of the clock signal;
determining the difference between the first and second peak voltage values; and
controlling a bias current applied to the clock generator based upon the difference between the first and second peak voltage values, wherein determining the difference between the first and second peak voltage values comprises:
storing a first electrical charge proportional to the first peak voltage value in a first capacitor and storing a second electrical charge proportional to the second peak voltage value in a second capacitor as part of a first operation of the switched capacitor circuit; and
storing the first electrical charge on a first plate of a third capacitor and storing the second electrical charge on a second plate of the third capacitor as part of a second operation of the switched capacitor circuit, the second operation subsequent to the first operation.

14. The method of claim 13, wherein determining the first peak voltage value comprises determining a maximum peak voltage value, and wherein determining the second peak voltage value comprises determining a minimum peak voltage value.

15. The method of claim 13, further comprising determining the first and second peak voltage values during a given operation of the switched capacitor circuit and determining the difference between the first and second peak voltage values during a subsequent operation of the switched capacitor circuit, the switched capacitor circuit having a given switch configuration during the given operation and a different switch configuration during the subsequent operation.

16. The method of claim 13, wherein determining the difference between the first and second peak voltage values further comprises storing a difference between the first and second electrical charges in a fourth capacitor as part of a third operation of the switched capacitor circuit, the third operation subsequent to the second operation.

17. The method of claim 13, further comprising producing a flag signal in response to a difference between the first and second peak voltage values matching a second reference voltage value within a threshold, the flag signal indicating that the clock generator is operating in a steady state condition.

18. An electronic circuit, comprising:
oscillator circuitry configured to produce a periodic signal; and
control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference, the switched capacitor circuitry configured to determine the maximum peak voltage value and the minimum peak voltage value of the periodic signal during a given time interval when a first set of switches is open and a second set of switches is closed, the switched capacitor circuitry further configured to determine the difference between the maximum and minimum peak voltage values during a subsequent time interval when the first set of switches is closed and the second set of switches is open.

19. An electronic circuit, comprising:
oscillator circuitry configured to produce a periodic signal; and
control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference, the switched capacitor circuitry further comprising:
a first peak voltage capturing circuitry including a first capacitor, the first peak voltage capturing circuitry configured to allow the first capacitor to store a first electrical charge proportional to the maximum peak voltage value during a first time interval, the first peak voltage capturing circuitry configured to implement a first AND operator with one of its inputs configured to receive an enabling signal and another of its inputs configured to receive an output of a first comparator, the first comparator configured to receive the periodic signal at its non-inverting input, the first comparator having its inverting input operably coupled to the first capacitor during assertion of the enabling signal, the first peak voltage capturing circuitry further comprising a first current source and a second current source, the first current source selectably coupled to the first capacitor via a switch, the switch controllable by the output of the first AND operator, and the second current source larger than the first current source; and
a second peak voltage capturing circuitry including a second capacitor, the second peak voltage capturing circuitry configured to allow the second capacitor to store a second electrical charge proportional to the minimum peak voltage value during the first time interval.

20. An electronic circuit, comprising:

oscillator circuitry configured to produce a periodic signal; and control circuitry operably coupled to the oscillator circuitry, the control circuitry including switched capacitor circuitry configured to determine a difference between maximum and minimum peak voltage values of the periodic signal, the control circuit configured to control a voltage amplitude of the periodic signal based upon the difference, the switched capacitor circuitry comprising:

a first peak voltage capturing circuitry including a first capacitor, the first peak voltage capturing circuitry configured to allow the first capacitor to store a first electrical charge proportional to the maximum peak voltage value during a first time interval;

a second peak voltage capturing circuitry including a second capacitor, the second peak voltage capturing circuitry configured to allow the second capacitor to store a second electrical charge proportional to the minimum peak voltage value during the first time interval; and a third capacitor operably coupled to the first and second capacitors via a first set of one or more switches, the third capacitor having a first plate and a second plate, the first plate configured to store the first electrical charge and the second plate configured to store the second electrical charge during a second time interval following the first time interval.

* * * * *